United States Patent
Guo et al.

(10) Patent No.: US 6,410,089 B1
(45) Date of Patent: Jun. 25, 2002

(54) CHEMICAL VAPOR DEPOSITION OF COPPER USING PROFILED DISTRIBUTION OF SHOWERHEAD APERTURES

(75) Inventors: Xin Sheng Guo, Los Altos Hills; Keith Koai, Los Gatos; Ling Chen, Sunnyvale; Mohan K. Bhan, Cupertino; Bo Zheng, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/513,723

(22) Filed: Feb. 24, 2000

Related U.S. Application Data (62) Division of application No. 09/023,437, filed on Feb. 13, 1998, now Pat. No. 6,050,506.

(51) Int. Cl.$^7$ .............................................. C23C 16/80
(52) U.S. Cl. ........................ 427/250; 427/252; 118/715
(58) Field of Search ................................ 427/250, 252; 118/715

(56) References Cited

U.S. PATENT DOCUMENTS

| | | | |
|---|---|---|---|
| 5,268,034 A | | 12/1993 | Vukelic ....................... 118/719 |
| 5,552,017 A | * | 9/1996 | Jang et al. |
| 5,744,192 A | * | 4/1998 | Nguyen et al. |
| 5,812,403 A | | 9/1998 | Fong et al. ............ 364/468.28 |
| 6,143,077 A | * | 11/2000 | Ikeda et al. |

OTHER PUBLICATIONS

Gelatos et al., "Chemical Vapor Deposition of Copper for Advanced On–Chip Interconnects," *MRS Bulletin*, Aug. 1994, pp. 49–54.

Doppelt et al., "Chemcial Vapor Deposition of Copper for IC Metallization: Precursor Chemistry and Molecular Structure," *MRS Bulletin*, Aug. 1994, pp. 41–48.

Doppelt et al., Chemcial Vapor Deposition of Copper for IC Metallization: Precursor Chemistry and Molecular Structure, MRS Bulletin, vol. 19, No. 8 Aug. 1994, pp. 41–48.

Gelatos et al., Chemical Vapor Deposition of Copper for Advanced On–Chip Interconnects, MRS Bulletin, vol. 19, No. 8, Aug. 1994, pp. 49–54.

* cited by examiner

*Primary Examiner*—Timothy Meeks
(74) *Attorney, Agent, or Firm*—Charles S. Guenzer, Esq.

(57) ABSTRACT

A showerhead used for dispensing gas over a wafer in chemical vapor deposition (CVD), especially for CVD of copper in a thermal process using a precursor such as HFAC-Cu-TMVS. The patterns of holes is tailored to compensate for thermal and other effects, in particular by increasing the density of holes toward the periphery of the wafer in three or more zones. Such a variable pattern is particularly useful for liquid precursors that are atomized in a carrier gas, in which case a second perforated plate in back of the showerhead face can be eliminated, thereby reducing the flow impedance and the required pressure of the liquid-entrained gas, which tends to deposit out at higher pressures. The reduced flow impedance is particularly useful for CVD of copper.

21 Claims, 5 Drawing Sheets

CHEMICAL VAPOR DEPOSITION OF COPPER USING PROFILED DISTRIBUTION OF SHOWERHEAD APERTURES

RELATED APPLICATIONS

This application is a division of Ser. No. 09/023,437, filed Feb. 13, 1998, now issued as U.S. Pat. No. 6,050,506, and is also related to Ser. Nos. 09/023,852 and 09/023,866, both filed Feb. 13, 1998 and now issued respectively as U.S. Pat. Nos. 6,106,625 and 6,079,356.

FIELD OF THE INVENTION

The invention relates generally to plasma reactors and their operation. In particular, the invention relates to the reactors capable of plasma-enhanced chemical vapor deposition of copper using a showerhead gas dispenser.

BACKGROUND ART

Plasma-enhanced chemical vapor deposition (PECVD) is an important and widely practice method of depositing films in advanced semiconductor integrated circuits. In PECVD, a precursor gas is admitted into a reaction chamber held at a reduced pressure, and oscillatory electric energy at a radio frequency (RF) is applied to the chamber to excite the gas into a plasma. The gas reacts with the surface of a wafer exposed to the plasma to form a film on the wafer of a composition derived from that of the precursor gas.

Probably the widest use of PECVD for silicon integrated circuits involves the deposition of silicon dioxide ($SiO_2$), also referred to as silica or simply oxide. The oxide forms an insulating layer, for example, between layers of electrical interconnects. The favored precursor for silicon dioxide formed by PECVD is tetraethyl orthosilicate (TEOS). PECVD is the favored technique for depositing oxide because the plasma supplies the activation energy rather than in a thermally activated process in which high temperature provides the energy. Therefore, the oxide can be deposited at relatively low temperatures over previously defined features, thereby reducing the thermal budget used for the oxide.

Sputtering (also called physical vapor deposition or PVD) has enjoyed the widest use in the deposition of layers of metals and other conductive materials because of its high deposition rate and low cost of precursor materials. However, sputtering is a generally ballistic process and has difficulty in coating narrow and deep apertures, of the sort required for via and contact holes between wiring layers. One favored technique for filling such holes is to first conformally coat the walls of the hole with a thin layer of titanium (Ti) and then to conformally coat the Ti-covered walls with a thin layer of titanium nitride (TiN). Thereafter, sputtered aluminum more easily fills into the hole. The Ti/TiN layer, generally referred to as a liner, provides good adhesion between the titanium and the oxide walls, and the TiN forms a barrier against aluminum migration.

It is possible to use sputtering to deposit an approximately conformal coating in holes of high aspect ratios, but much effort is being expended in using CVD or PECVD for one or both of these layers. It is known to deposit CVD TiN using tetrakis-dimethyl-amido titanium (TDMAT) as a precursor. This material is a metal-organic compound which is a liquid at room temperature. The TDMAT CVD process requires thermal decomposition, preferably around 450° C., and a subsequent plasma treatment to remove the carbon content in the as-deposited film. It is also known to deposit CVD Ti using titanium tetrachloride ($TiCl_4$) as the precursor. $TiCl_4$ is also a liquid at the temperatures involved and so requires a bubbler or a liquid injector to produce a gas-phase precursor, but this difference does not directly affect most aspects of the plasma processing in which the gas entraining the $TiCl_4$ is energized into a plasma adjacent to the wafer so as to activate the reaction causing titanium to deposit on the wafer.

The chemical vapor deposition of a metal layer in a plasma chamber introduces problems not experienced in PECVD chambers used for the deposition of dielectrics. Almost inevitably, some of the metal is deposited on parts of the chamber other than the wafer. The metal may be deposited on dielectric members in the chamber intended to electrically isolate various portions of the chamber. At worst, the extra metal could short out the RF-biased gas showerhead. At a minimum, the changing extent of the grounding surfaces will cause the electrical fields to vary, thus causing the uniformity of the plasma and thus the uniformity of deposition to vary over time. Accordingly, the chamber must be designed to both minimize the effect of any metal deposited on chamber parts in the processing area and also to minimize the deposition of metal in areas away from the processing.

Very recent work of others has demonstrated that the titanium deposition rate and deposition uniformity using $TiCl_4$ as the precursor can be greatly increased by maintaining the wafer at a relatively high temperatures during the plasma deposition, despite the fact that deposition is primarily plasma activated. A desired temperature range extends between 600° C. and 750° C. At these temperatures, there are several problems not experienced at the lower temperatures experienced in dielectric deposition.

Zhao et al. have addressed some of these problems, at least for TiN, in U.S. Pat. No. 5,846,332, incorporated herein by reference in its entirety, which discloses the CVD reactor illustrated in cross-section in FIG. 1. This figure illustrates many of the features of the TiNxZ CVD reactor available from Applied Materials, Inc. of Santa Clara, Calif.

Figure 1:
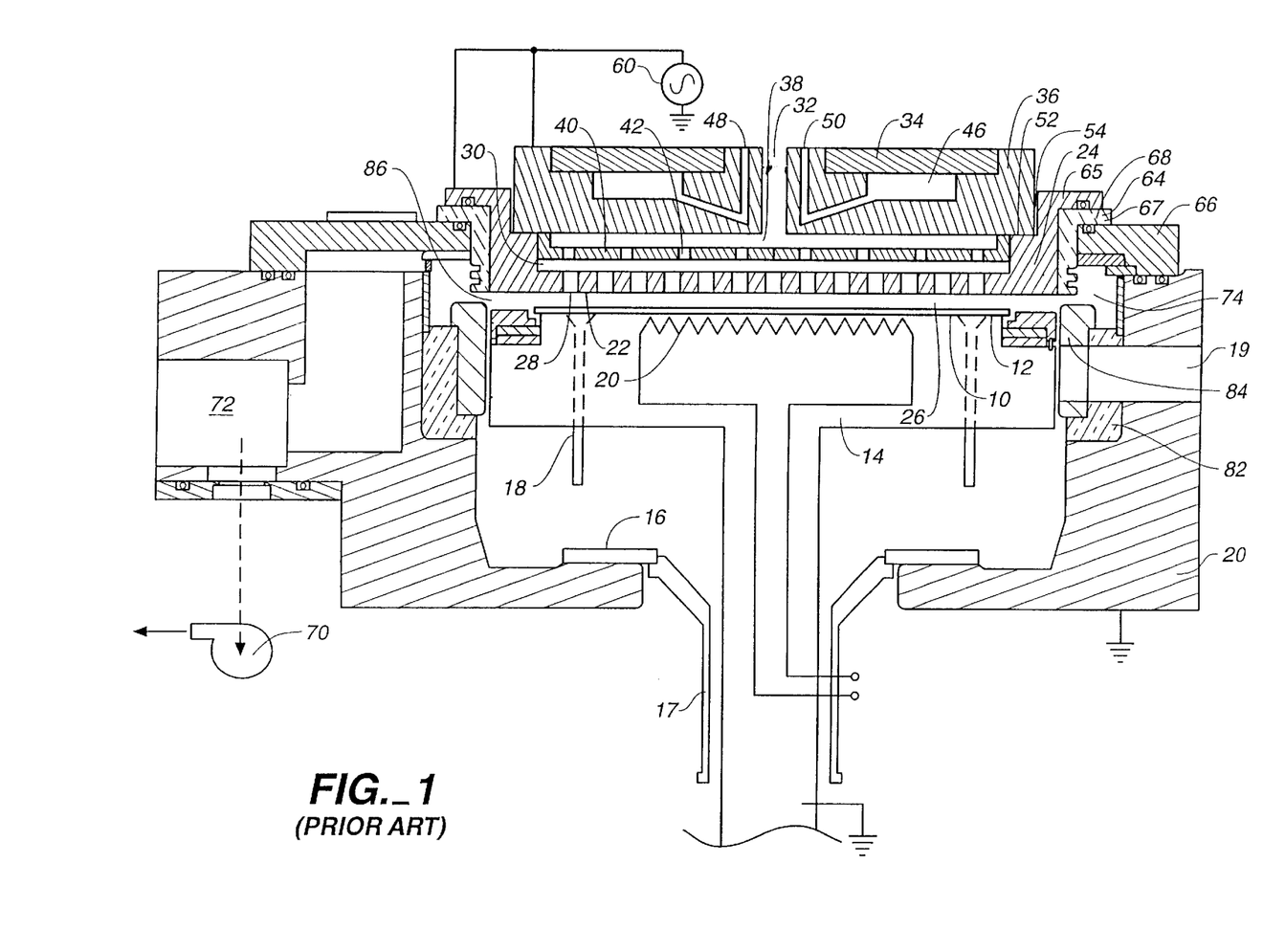
FIG. 1 is a cross-sectional view of a prior-art chemical vapor deposition plasma reactor enhanced for deposition of a conductive material such as titanium nitride.

A wafer 10 is supported on a surface 12 of a heater pedestal 14 illustrated in its raised, deposition position. In its lowered, loading position a lifting ring 16 attached to a lift tube 17 lifts four lift pins 18 slidably fitted into the heater pedestal 14 so that the pins 18 can receive the wafer 10 loaded into the chamber through a loadlock port 19 in the reactor body 20. The heater pedestal 14 includes an electrical resistance heater 21, which controllably heats the wafer 10 it supports. The temperatures experienced in a TiN reactor are low enough to allow the heater pedestal 14 and attached heater to be principally formed of aluminum. Often at least the upper part of the heater pedestal 14 is referred to simply as the heater.

In its upper, deposition position, the heater pedestal 14 holds the wafer 10 in close opposition to a lower surface 22 of a faceplate 24, a processing region 26 being defined between the wafer 10 and the surface 22. The faceplate 24, often referred to as a showerhead, has a large number of apertures 28 in its lower surface 22 communicating between a lower distribution cavity 30 and the processing region 26 to allow the passage of processing gas. The processing gas is supplied through a gas port 32 formed at the center of a water-cooled gas box plate 36 made of aluminum. The upper side of the gas box plate 36 is covered by a water cooling cover plate 34 surrounding the upper portion of the gas box plate 36 that includes the gas port 32. The gas port 32 supplies the processing gas to an upper cavity 38 separated from the lower cavity 30 by a blocker plate 40, also having a large number of apertures 42 therethrough. One purpose of the cavities 30, 38, the perforated showerhead 24, and blocker plate 40 is to evenly distribute the processing gas over the upper face of the wafer 10.

Figure 2:
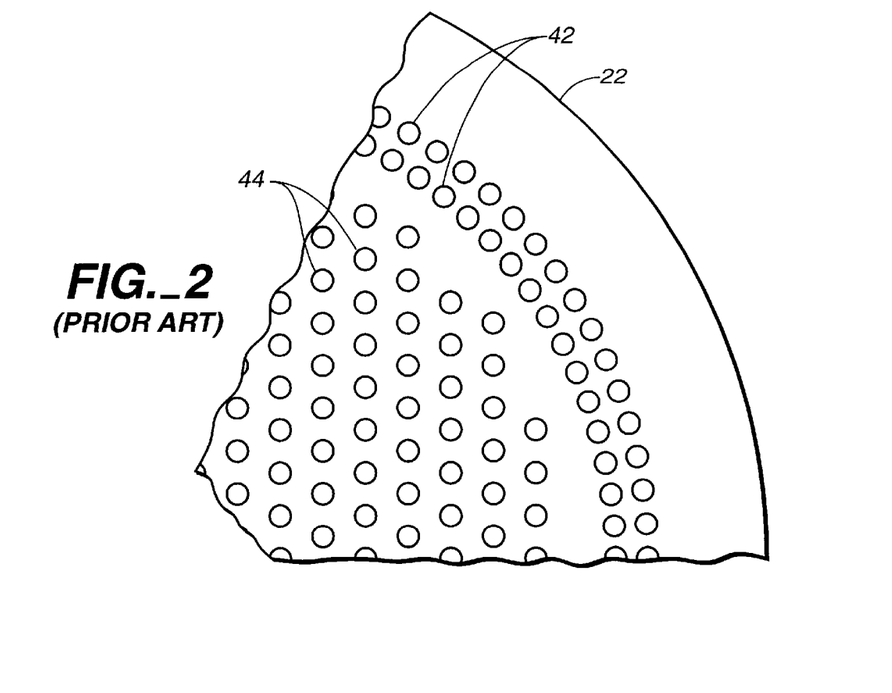
FIG. 2 is a plan view of a showerhead electrode used with the reactor of FIG. 1.

A standard showerhead provided with the TiNxZ chamber has a somewhat irregular hole pattern, illustrated in the partial plan view of FIG. 2 of the showerhead face 22. A first set of holes 42 are arranged in two circles generally bracketing the periphery of the wafer 10. A second set of holes 44 are arranged. in an hexagonal close packed array inside the two circles. The spacings of both sets of holes 42, 44 equal about the same small value so that the distribution of holes is fairly uniform. Law et al. in U.S. Pat. No. 4,960,488 disclose a showerhead having two densities of holes, but different gases are injected through the two sets of holes.

Returning to FIG. 1, a single circular channel or moat 46 is formed in the top of the gas box plate 36 and is sealed by the cooling water cover plate 34. Two water ports 48, 50 are formed in the center portion of the gas box plate 36 also occupied by the gas port and respectively act as inlet and outlet for cooling water supplied to cool the showerhead 24. Often a 50:50 mixture of water and glycol is used to efficiently remove heat. and maintain process stability. This cooling liquid and any other cooling liquid will be henceforward referred to as cooling water. The gas box including the gas box plate 36 and the cooling water cover plate 34 rests on a fairly narrow circular ledge 52 of the showerhead 24, and a gap 54 is necessarily formed between the outer circumferential surface of the cooling water cover plate 34 and the upper, inner annular surface of the showerhead 24 because of the different temperatures that may develop in the two pieces. The cooling water cools the showerhead 24 to maintain it at a low temperature despite the plasma heating and resistive heating of the heater pedestal 14. Thereby, the processing gas tends not to coat the showerhead 24 and clog its apertures 28.

An RF power source 60 is connected to the showerhead 24 and to the gas box plate 36 and acts against the grounded chamber body 20 and the grounded heater pedestal 14 to form a plasma of the processing gas in the processing region 26. A lid isolator 64 is interposed between the showerhead 24 and a metal lid rim 66, which can be lifted off the chamber body 20 to open the chamber to provide maintenance access. The lid isolator 64 is made of an electrically insulating ceramic to isolate the RF-biased showerhead 24 from the grounded chamber body 20. A flange 66 of the showerhead 24 rests on a flange 67 of the isolator 64 through an upper, outer, bottomface 68 located above its ledge 52 supporting the gas box plate 36. Law et al., ibid., disclose an alternative arrangement of the showerhead isolator and the gas box plate.

Figure 3:
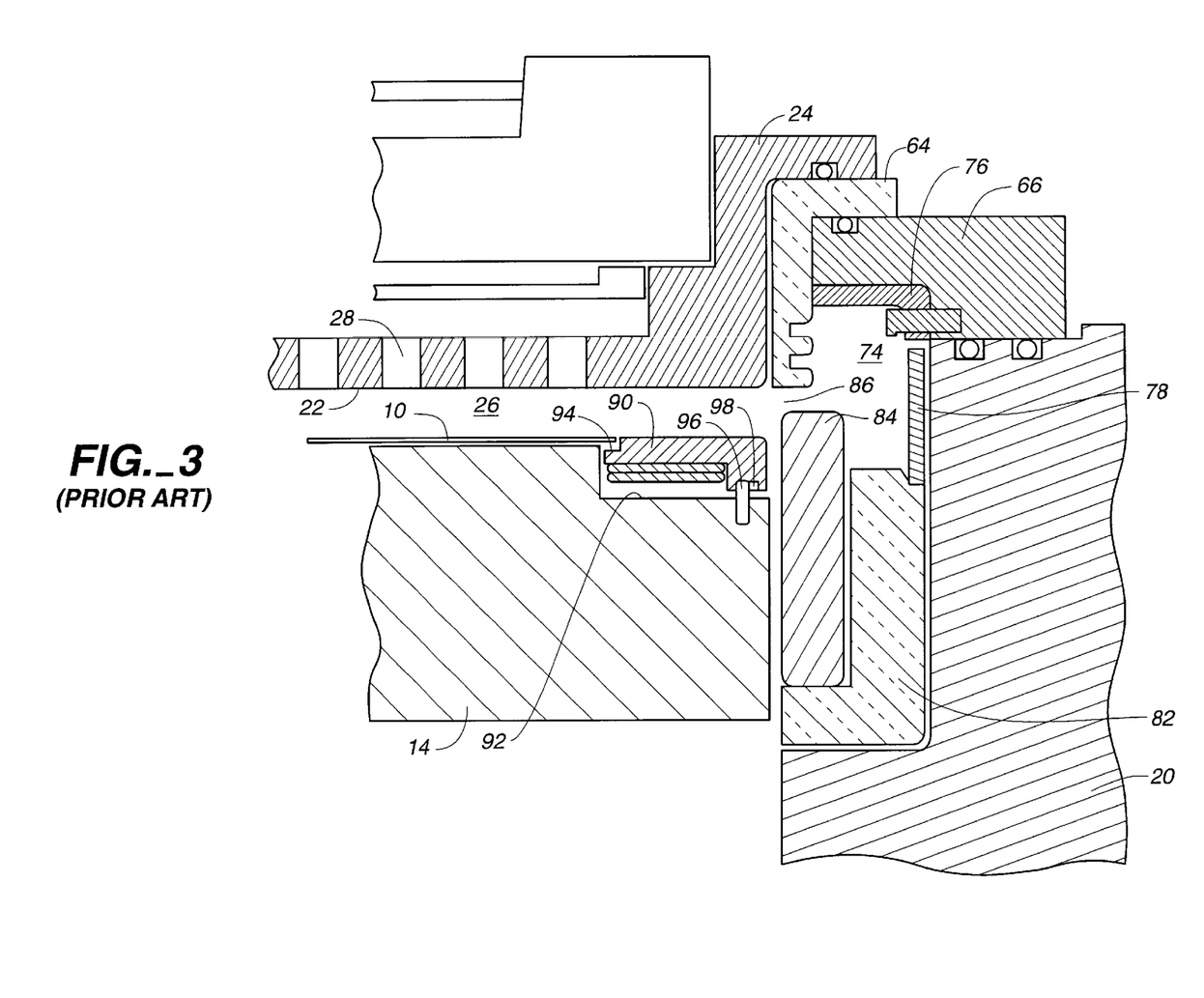
FIG. 3 is a cross-sectional view of an area of the reactor of FIG. 1 at the periphery of the heater pedestal supporting the wafer and including the showerhead electrode and the vacuum pumping channel.

The vacuum within the reactor is maintained by a vacuum pump 70 connected to a pump plenum 72 in the reactor body 20, which connects to an annular pumping channel 74. FIG. 3 better illustrates the pumping channel 74 defined by the lid isolator 64, a lid liner 76, an outer shield 78, an insulating chamber insert ring 82 fit in the chamber body 20, and a metal inner shield 84 fit in the chamber insert ring 82. The pumping channel 74 is connected to the processing region 26 through a straight choke aperture 86 formed between the lid isolator 24 and the metal inner shield 84. The liners 76, 78 can be easily removed during servicing to prevent build up of a metallic coating on the walls of the pumping channel 74.

An edge ring 90 is positioned within an annular ledge 92 located at the upper peripheral edge of the heater pedestal 14. The edge ring 90 is generally circular but may be modified to conform to a flat of the wafer 10. The edge ring 90 operates to center the wafer 10 through unillustrated centering bosses located at the edge of an inwardly facing annular ledge 94 of the centering ring 90. The edge ring 90 also operates to thermally isolate the ledge 92 of the heater pedestal 14 otherwise exposed by the wafer 10 on top of the heater pedestal 14. The ring 90 is supported by three ceramic pins 96 fixed to the heater pedestal 14 but sliding in short radial grooves 98 at the bottom of an outer, lower arm 100 of the edge ring 90. As better illustrated in the sectioned isometric view of FIG. 4, two thermally isolating rings 102, 104 are fixed to the bottom of an inner, upper arm 106 of the edge ring 90 by flat-headed fasteners 108. Two washers 110 placed on each fastener 108 creates a first thermally isolating gap between the upper arm 106 of the centering ring 100 and the upper isolating ring 102, a second one between the two isolating rings 102, 104, and a third one between the lower isolating ring 104 and the bottom of the ledge 92.

Figure 4:
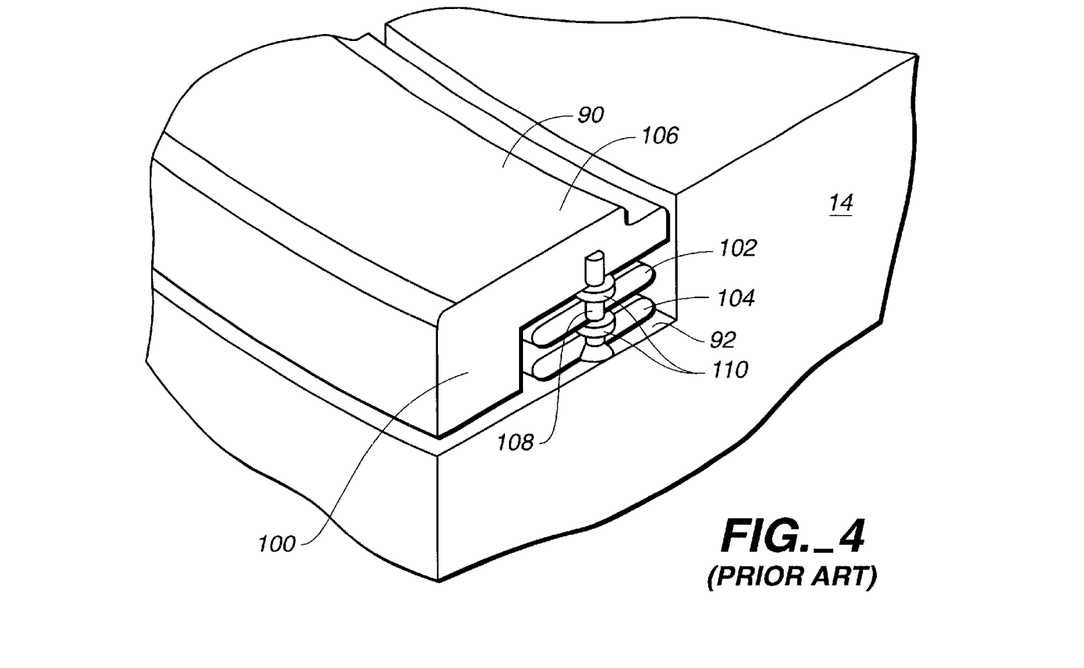
FIG. 4 is an isometric view of a thermally isolating centering ring disposed at the periphery of the heater pedestal of FIG. 1.

The structure of the thermally floating edge ring 90 and its two thermally isolating rings 102, 104 serves to thermally shield the edge ring 90 from the underlying heater pedestal 14. As a result, the periphery of the heater pedestal 14 exposed by the wafer 10 is maintained at a substantially lower temperature than the central portion to avoid undesirable film buildup during extended use. At the central portion of the heater pedestal 14, the temperature profile is flattened so that the uniformity of deposition is greatly improved.

Although the above features contribute to an improved operation of a CVD reactor, particularly one intended for deposition of a metal or other conductor such as TiN, further improvements are desired.

The deposition should be made as uniform as possible by any available means. If there is any non-uniformity towards the edges, the variation should be toward a somewhat thicker layer. If the variation is toward a thinner layer, there is a danger that a vanishingly small thickness is deposited in some portion of the wafer, thus severely impacting yield of operable chips. However, experience has shown that even with the improved chamber of FIGS. 1 through 4 the TiN layer tends to thin toward the edges.

SUMMARY OF THE INVENTION

The invention may be summarized as a plasma reaction chamber, particularly one intended for chemical vapor deposition of conductive materials such as titanium, titanium nitride, and copper.

The invention includes a design intended to compensate for thermal gradients and other across the face of the heater pedestal supporting the wafer and of the showerhead supplying gas to the processing area over the wafer.

According to the invention, the distribution of holes in the showerhead is varied across the radius of the wafer to compensate for temperature gradients and other effects. Typically, this requires additional gas flow at the outer edges and hence an increased density of total aperture area closer to the periphery. The shape of the apertures may be modified to have a relatively large diameter on the processing side of the faceplate. With a carefully tailored distribution of faceplate apertures, the perforated blocker plate in back of the showerhead faceplate may be eliminated and the minimum cross section of the apertures increased, thereby reducing aerodynamic impedance and allowing a lower pressure of the precursor gas in the supply lines.

DETAILED DESCRIPTION OF THE PREFERRED EMBODIMENTS

One way of addressing the non-uniformity problem is to provide a greater mass flow of processing gas to the peripheral edge of the wafer 10 since the edge deposition has been observed to be thinner than that in the central area. A first embodiment of a showerhead 120 achieving higher edge deposition is illustrated in plan view in FIG. 5. An outer set of outer holes 122 are arranged in circles bracketing the periphery of the wafer 10, similarly to the configuration of FIG. 2. However, the density is significantly increased. For a 200 mm wafer, each circle contains 250 to 300 holes, that is, a circumferential spacing of about 1 mm. This amounts to an offset of 1.2°. The two circles are radially separated by about 2.8 mm. Radially inward of the outer holes 122 is another set of middle holes 124 arranged in a circle about 2.3 mm inward from the inner circle of the outer holes 122. The circumferential density of these middle holes 124 is about one-half of the outer holes 122, that is, a circumferential spacing of about 2 mm. Within the circle of the middle holes 122, there is formed an hexagonally close-packed array of inner holes 126 with a spacing between nearest neighbors of about 4.4 mm. This spacing amounts to about twice that of the middle holes 124. The boundary between the triangularly arranged inner holes 126 and the circularly arranged middle holes 126 should be manually selected to place the holes fairly close together without compromising mechanical integrity. All the holes 122, 124, 126 have a fairly conventional cross section, as illustrated in FIG. 6, of a wide upper part 128 and a narrow lower part 130.

Figure 5:
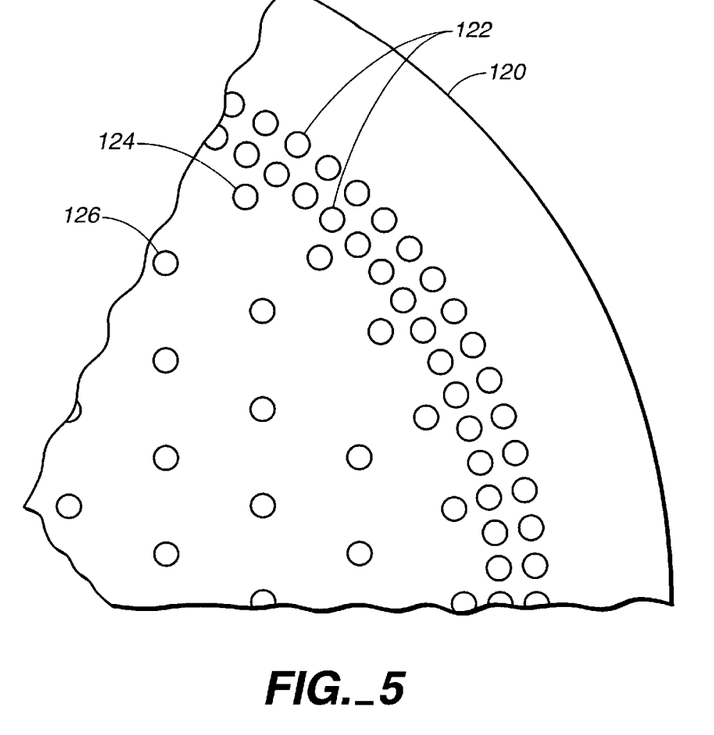
FIG. 5 is a plan view of a first embodiment of a showerhead of the invention.
Figure 6:
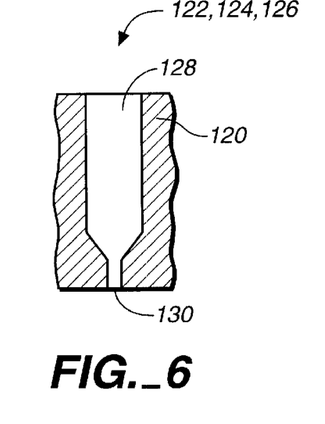
FIG. 6 is a cross-sectional view of a showerhead hole.

The configuration of holes 122, 124, 126 in the showerhead 120 of FIG. 5 provides a substantially higher density of holes 122 on the outer periphery and also an additional intermediate density of holes 124 between the hexagonally close-packed inner holes 126 and the circularly arranged outer holes 122. The progressive density ratios from the outside in is about 3:1 and 2:1, but the invention of this embodiment encompasses a first ratio between 2:1 and 4:1 and a second ratio between 1.5:1 and 3:1.

The showerhead 120 has been tested with TiN deposition. It has been observed to achieve an over coating near the edges. Although perfect uniformity would be more desirable, a slight over coating is more desirable than a slight undercoating. In either case, there are process variations which seemingly randomly vary the thickness up and down. If the mean deposition at the edge is an undercoat, then a given negative variation may render the TiN film to be overly thin and cause the chip to catastrophically fail. On the other hand, if the mean value is an overcoat, the same given negative variation is likely to produce a good chip, and an equal positive variation is unlikely to produce significant changes in the chip performance since the thickness of the Ti or TiN layer is mostly limited by throughput considerations rather than by performance considerations.

For TiN deposition, the showerhead 120 is most economically formed of aluminum, although it may be desirable for corrosion resistance to nickel plate the aluminum to a thickness of 7 to 10 μm. However, for the hotter Ti depositions being contemplated, it has been discovered even the nickel coating is inadequate, and any thicker nickel coating would be prone to cracking, a source of particles. Thus, for hot Ti deposition, the showerhead should be formed of bulk nickel even though this is an expensive material and is difficult to machine. Not only does bulk nickel offer a low-corrosion material, but it better withstands the thermal cycling of a hot PECVD process. Foster has disclosed such a nickel showerhead in U.S. Pat. No. 5,665,640. Similarly, the perforated blocker plate 42 (FIG. 1) in back of the faceplate of the showerhead should be formed of solid nickel for hot Ti deposition.

Figure 7:
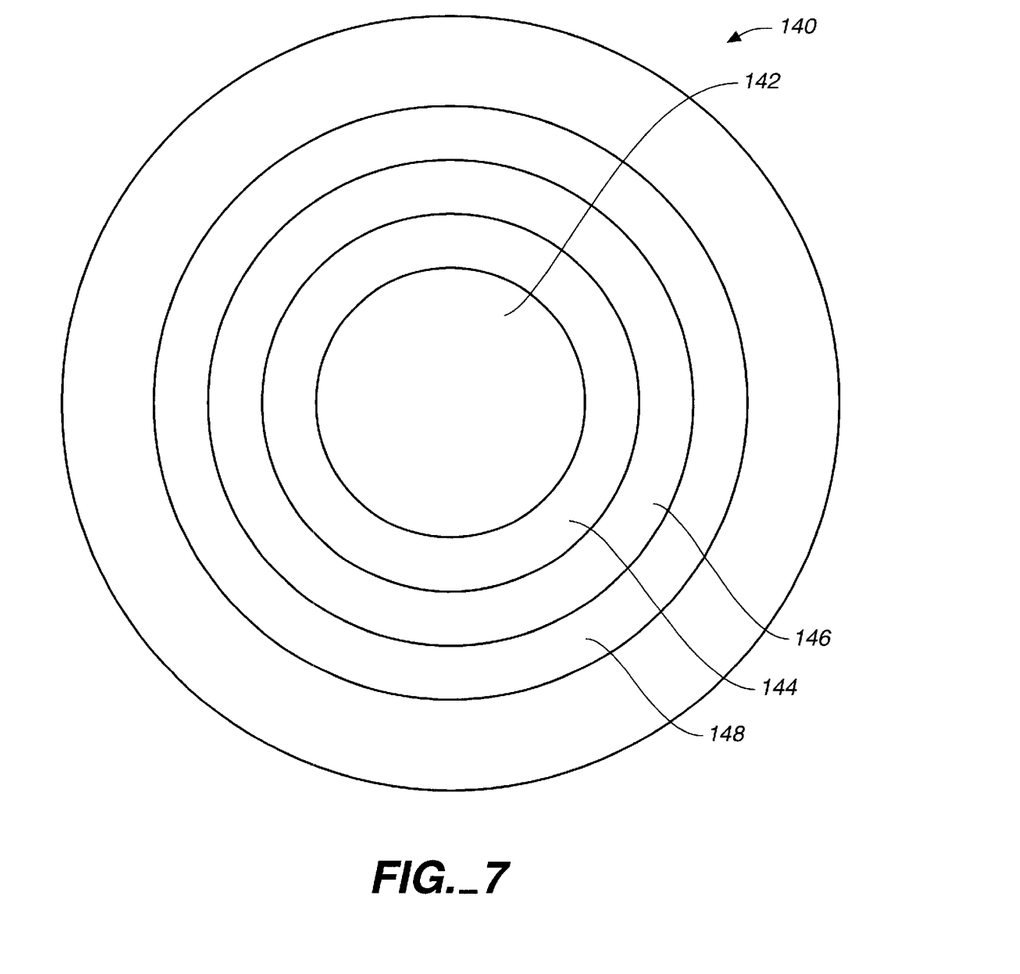
FIG. 7 is a plan view of a second embodiment of a showerhead of the invention.

The embodiment of FIG. 5 for the showerhead is a specific example of a more general embodiment illustrated in plan view in FIG. 7 in which the hole density N(r) varies as a function of the radius from the center of a showerhead 140, where N(r) is a monotonically increasing function. For example, the hole density may be uniform at a value $N_0$ in a central zone 142 having a radius $r_0$ and progressively increase in outer zones 144, 146, 148. An example of the dependence is the linear function $$N(r) = N_0\left(\frac{r - r_0}{r_0}\right)$$

for the outer zone 144, 146, 148, it being assumed that the value of r is chosen as some median value within the zone. Exemplary values for N(r) are 10%, 20%, and 30% over the standard central density $N_0$. Even more variation is encompassed by the invention, but a minimum variation of 10% from the central value may be defined. The spatial and density ranges need to be determined, preferably by experimental measurement of either the film deposition profile or the gas flow patterns. Our observation is that such variation of hole density needs to implemented beginning at about 150 mm from the periphery of the wafer.

Such a tailored profile is especially useful when the CVD precursor is a liquid, for example in copper CVD or titanium CVD, which requires a bubbler or similar atomizer. With the tailored hole profile, the blocker plate 40 of FIG. 1 can be eliminated. Although the blocker plate is effective at providing a fairly uniform pressure in the lower cavity 30, it does so at the expense of a high flow impedance. That is, the atomized precursor needs to be provided at high pressure through the blocker plate. Atomized precursors are thermodynamically unstable, so a high pressure of the precursors is highly likely to cause a significant deposition in back of the blocker plate 40 and in the lines back to the bubbler. In contrast, with a carefully profiled hole distribution, an even pressure in back across the faceplate of the showerhead is not required, and the precursor can be delivered at a lower pressure, producing less deposition on the backside of the showerhead.

A profiled hole density has been successfully applied to the chemical vapor deposition of copper in a thermal process, the wafer being held at about 200° C., using the well known precursor HFAC-Cu-TMVS, also known as Cu(I). It is available from Schumacher, Inc. of Carlsbad, Calif. under the name of Cupra-Select. This process is described by Gelatos et al. in "Chemical vapor deposition of copper for advanced on-chip interconnects," MRS Bulletin, vol. 19, no. 8, August 1994, pp. 40–53. Alternative precursors and processes are described by Doppelt et al. in "Chemical vapor deposition of copper for IC metallization: precursor chemistry and molecular structure," ibid., pp. 41–48. The precursor gas HFAC-Cu-TMVS deposits copper. at a rate approximately linearly proportional to the pressure. Experience with a uniform showerhead pattern together with blocker plates showed more copper deposition in the supply channels than on the wafer. Profiled circular arrangements of holes were utilized for a 200 mm wafer according to the distribution listed in TABLE 1, which is based upon a constant radial gap between the circles.

TABLE 1

| Circle Number | Number of Holes | Circle Radius (inch) | Hole Density (cm$^{-2}$) |
|---|---|---|---|
| 1 | 1 | 0.00 | 6.09 |
| 2 | 6 | 0.18 | 4.57 |
| 3 | 13 | 0.36 | 4.95 |
| 4 | 19 | 0.54 | 4.82 |
| 5 | 25 | 0.72 | 4.76 |
| 6 | 31 | 0.90 | 4.72 |
| 7 | 38 | 1.08 | 4.82 |
| 8 | 44 | 1.26 | 4.79 |
| 9 | 50 | 1.44 | 4.76 |
| 10 | 57 | 1.62 | 4.82 |
| 11 | 63 | 1.80 | 4.80 |
| 12 | 70 | 1.98 | 4.85 |
| 13 | 77 | 2.16 | 4.89 |
| 14 | 84 | 2.34 | 4.92 |
| 15 | 92 | 2.52 | 5.00 |
| 16 | 100 | 2.70 | 5.08 |
| 17 | 108 | 2.88 | 5.14 |
| 18 | 117 | 3.06 | 5.24 |
| 19 | 127 | 3.24 | 5.37 |
| 20 | 137 | 3.42 | 5.49 |
| 21 | 148 | 3.60 | 5.63 |
| 22 | 161 | 3.78 | 5.84 |
| 23 | 173 | 3.92 | 5.99 |
| 24 | 182 | 4.06 | 6.03 |

The hole densities shown in the table are based upon bands centered on the hole circles. Much of the variations, especially for the inner circles, are caused by quantization error arising from use of just a few holes in the circle. Other distributions are available which eliminate these quantization errors.

The profiled hole distribution allow the holes to be formed in a straight cylindrical shape with a diameter of 1.6 mm versus the usual diameter of 0.4 mm, and it further allows the elimination of the blocking plate. These two features reduce the aerodynamic impedance so that the copper precursor gas can be supplied at a much lower pressure. Nonetheless, the copper thickness uniformity was improved over the standard showerhead from 5% to 3%.

It is also appreciated that the non-uniformity of apertures can be accomplished by varying the size of the apertures across the face of the showerhead since a larger aperture produces a larger flow through it.

Figure 8:
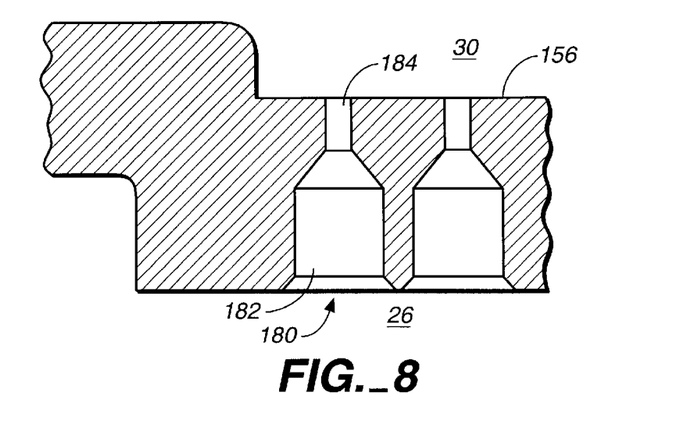
FIG. 8 is a cross-sectional view of another form of showerhead holes.

The shape of holes 28 in the showerhead 24 can be improved to decrease thermal transfer between the showerhead 24 and the plasma. As illustrated in cross section in FIG. 8, each hole 180 includes a wider cylindrical portion 182 at the side facing the plasma in the processing area 26, and it is connected to a narrower cylindrical portion 184 facing the bottom cavity 30. This configuration is the opposite of the standard configuration of FIG. 6 and exposes a minimum amount of the showerhead material directly to the plasma while the more massive back of the showerhead provides mechanical strength.

The patent applications Ser. Nos. 09/023,852 and 09/023,866, now issued respectively as U.S. Pat. Nos. 6,106,625 and 6,079,356 and incorporated herein by reference in their entireties, describe other features of plasma reaction chambers useful for the deposition of titanium and titanium nitride. Some aspects of the showerhead of the present invention are usefully applied to these reaction chambers.

These features alone or in combination with other features provide for a more uniform temperature distribution or a more uniform mass flow and hence a more uniform coating thickness. Nonetheless, these advantages are accomplished with only small changes to the conventional showerhead holes.

What is claimed is:

1. A copper CVD process, comprising supplying a precursor gas capable of depositing copper in a thermal process through a line to a port communicating with a gas cavity formed at the back of a perforated faceplate including a number of holes therethrough, a substantially circularly symmetric distribution of said holes about a central axis of said perforated faceplate varying by at least 10%.

2. The process of claim 1, wherein said precursor gas comprises HFAC-Cu-TMVS.

3. The process of claim 1, wherein said gas cavity abuts said perforated faceplate and said port.

4. The process of claim 1, wherein said distribution varies by at least 20% about said central axis.

5. The process of claim 4, wherein said distribution varies by at least 30% about said central axis.

6. A copper CVD process, comprising supplying a precursor gas capable of depositing copper in a thermal process through a line to a port communicating with a gas cavity formed at the back of a perforated faceplate including a number of holes therethrough, a distribution of said holes about a central axis of said perforated faceplate varying by at least 10%, said pattern comprising:
   a first plurality of said holes in a first zone occupying a central portion of said perforated faceplate and being arranged with a first density of said holes;
   a second plurality of said holes in a second zone of said perforated faceplate surrounding said first zone and being arranged with a second density of said holes greater than said first density; and
   a third plurality of said holes in a third zone of said perforated faceplate surrounding said first zone and being arranged with a third density of said holes.

7. The process of claim 6, wherein said first plurality of holes are arranged in an hexagonal close packed arrangement.

8. The process of claim 7, wherein said second plurality of holes is arranged in a first circular arrangement.

9. The process of claim 8, wherein said third plurality of holes is arranged in a second circular arrangement.

10. The process of claim 9, wherein said second circular arrangement comprises two circles of said holes.

11. The process of claim 10, wherein said first plurality of holes are arranged in a circular arrangement.

12. The process of claim 6, wherein said third density differs from said second density.

13. The process of claim 6, wherein said distribution of holes is arranged in a generally symmetric pattern about a central axis of said perforated faceplate.

14. A copper CVD process, comprising supplying a precursor gas capable of depositing copper in a thermal process through a line to a port communicating with a gas cavity formed at the back of a substantially circular perforated faceplate including a number of holes therethrough, receiving and passing said precursor gas from said port, wherein a density of said holes varies with a radius from a center of said perforated faceplate to produce a thicker deposition at an entire circumferential peripheral portion of said substrate than at a central portion of said substrate.

15. The process of claim 14, wherein said precursor gas comprises HFAC-Cu-TMVS.

16. The process of claim 14, wherein said density is higher at said peripheral portion than at said central portion.

17. The process of claim 14, wherein no other perforated plate is disposed between said perforated faceplate and said port.

18. A CVD process for deposition of copper, comprising supplying a precursor gas capable of depositing copper in a thermal process through a line to a single port communicating with a gas cavity formed at the back of a substantially circular perforated faceplate including a number of holes therethrough, wherein no other perforated plate is disposed between said perforated faceplate and said port, and wherein said plurality of holes are distributed across a radius of said perforated faceplate in a substantially circularly symmetric pattern about a central axis of said circular perforated faceplate with a density variation of at least 10%.

19. The process of claim 18, wherein said holes have a higher density at an outer portion of said perforated faceplate than in a central portion of said perforated faceplate.

20. The process of claim 18, wherein said precursor gas comprises HFAC-Cu-TMVS.

21. The process of claim 18, wherein said port is disposed along a central axis of said perforated faceplate.

* * * * *